(12) United States Patent
Choi et al.

(10) Patent No.: US 7,501,692 B2
(45) Date of Patent: Mar. 10, 2009

(54) SEMICONDUCTOR LEAD FRAME, SEMICONDUCTOR PACKAGE HAVING THE SAME, AND METHOD OF PLATING THE SAME

(75) Inventors: Woo-suk Choi, Yongin-si (KR);
Joong-do Kim, Yongin-si (KR);
Eun-hee Kim, Yongin-si (KR);
Soo-bong Lee, Yongin-si (KR)

(73) Assignee: Samsung Techwin Co., Ltd., Changwon (KR)

( * ) Notice: Subject to any disclaimer, the term of this patent is extended or adjusted under 35 U.S.C. 154(b) by 0 days.

(21) Appl. No.: 11/194,872

(22) Filed: Aug. 1, 2005

(65) Prior Publication Data
US 2006/0071310 A1    Apr. 6, 2006

(30) Foreign Application Priority Data
Oct. 5, 2004    (KR) .................. 10-2004-0079188

(51) Int. Cl.
*H01L 23/495* (2006.01)

(52) U.S. Cl. .............................. 257/666; 257/E23.054; 257/677; 257/741; 361/529; 361/524

(58) Field of Classification Search .......... 257/E23.054, 257/666, 677, 766, 741, 768, 667, 672; 361/529, 361/524; 206/328; 428/647
See application file for complete search history.

(56) References Cited

U.S. PATENT DOCUMENTS

| | | | | |
|---|---|---|---|---|
| 4,749,626 A | * | 6/1988 | Kadija et al. ................ | 428/647 |
| 4,971,196 A | * | 11/1990 | Kitamura et al. ............ | 206/204 |
| 5,393,573 A | | 2/1995 | MacKay | |
| 5,521,432 A | * | 5/1996 | Tsuji et al. .................. | 257/677 |
| 5,585,195 A | * | 12/1996 | Shimada ..................... | 428/548 |
| 6,362,950 B1 | * | 3/2002 | Kamigawa et al. .......... | 361/523 |
| 6,392,293 B2 | * | 5/2002 | Sugihara et al. ............ | 257/690 |
| 6,395,583 B1 | * | 5/2002 | Kubara et al. ............... | 438/123 |
| 6,478,944 B1 | * | 11/2002 | Ishiyama .................... | 205/102 |
| 6,508,927 B2 | * | 1/2003 | Yanada et al. ............... | 205/241 |
| 6,545,344 B2 | * | 4/2003 | Abbott ....................... | 257/666 |
| 6,560,090 B2 | * | 5/2003 | Uenishi et al. .............. | 361/529 |
| 6,583,500 B1 | * | 6/2003 | Abbott et al. ............... | 257/666 |
| 6,593,643 B1 | * | 7/2003 | Seki et al. ................... | 257/677 |
| 6,960,396 B2 | * | 11/2005 | Shimokawa et al. ........ | 428/646 |
| 7,029,760 B2 | * | 4/2006 | Mori et al. .................. | 428/600 |
| 2002/0187364 A1 | | 12/2002 | Heber et al. | |
| 2003/0025182 A1 | | 2/2003 | Abys et al. | |
| 2003/0226758 A1 | | 12/2003 | Egli | |
| 2004/0183166 A1 | * | 9/2004 | Abbott ....................... | 257/666 |
| 2006/0145311 A1 | * | 7/2006 | Abbott ....................... | 257/666 |

OTHER PUBLICATIONS

Office Action established for CN 200510106953.7 (Dec. 28, 2007).

* cited by examiner

*Primary Examiner*—Chris C. Chu
(74) *Attorney, Agent, or Firm*—Drinker Biddle & Reath LLP

(57) ABSTRACT

Provided are a semiconductor lead frame, a semiconductor package having the semiconductor lead frame, and a method of plating the semiconductor lead frame. The method includes preparing a substrate formed of a Fe—Ni alloy (alloy 42), and a plating layer that contains grains less than 1 micrometer in size and is plated on the substrate. The growth of whiskers when a Sn plated layer is formed on a substrate formed of a Fe—Ni alloy (alloy 42) can be suppressed by minimizing the grain size of the Sn plated layer.

16 Claims, 4 Drawing Sheets

Fe-Ni42

SEMICONDUCTOR LEAD FRAME, SEMICONDUCTOR PACKAGE HAVING THE SAME, AND METHOD OF PLATING THE SAME

CROSS-REFERENCE TO RELATED PATENT APPLICATION

This application claims the priority of Korean Patent Application No. 10-2004-0079188, filed on Oct. 5, 2004, in the Korean Intellectual Property Office, the disclosure of which is incorporated herein in its entirety by reference.

BACKGROUND OF THE INVENTION

1. Field of the Invention

The present invention relates to a semiconductor lead frame using tin in which the formation of whiskers is reduced by reducing a grain size, a semiconductor package having the lead frame, and a method of plating the lead frame.

2. Description of the Related Art

Conventionally, a semiconductor lead frame is a core component of a semiconductor package that connects inner components of the semiconductor package to external terminals. Semiconductor lead frames are formed in various shapes and structures through stamping processes or etching processes and are used to form semiconductor packages with other components such as semiconductor chips.

A semiconductor lead frame includes a die pad, on which semiconductor chips are mounted. The die pad is formed on a center of a substrate and the corners of the die pad are supported by tie bars. A plurality of inner leads is adjacently connected by a dambar. A plurality of outer leads are disposed on the opposite side of the dambar from the inner leads so that the outer leads can be connected to external terminals when the semiconductor package is fabricated. Also, a wire bonding region for connecting each terminal of a semiconductor chip to be mounted is formed at ends of the inner leads.

The outer leads of the lead frame must be solder wettable and anti-corrosive to facilitate soldering with external terminals since the outer leads are directly electrically connected to external terminals. To attain solder wettability, a soldering base composed of an alloy of Sn and Pb is plated on a predetermined region of the outer leads.

However, recently, the Sn—Pb alloy has been replaced by pure Sn since Pb can not be used due to environmental regulations. One of the problems of plating Sn on a semiconductor lead frame is the generation of whiskers. The whiskers are tin single crystals having a length of a few millimeters and a width of 1-5 micrometers in the shape of a beard. Due to the growth of the whiskers, disconnections of the lead frame from external terminals can occur or, due to broken pieces of the whiskers, malfunctions of electronic components can occur.

A method of minimizing whiskers by implanting ions of Pb, Bi, Sb, Ti, Cu, Ag, Au, and Cd in the Sn plating is disclosed in U.S. Pat. No. 5,393,573. A method of minimizing the whiskers in a Sn or Sn alloy plating layer by controlling an angle of crystal face to 5-22° is disclosed in U.S. Patent Publication No. 2003-0226758. A method of minimizing the whiskers in a Sn or Sn alloy plating layer by controlling tensile strength of the plating layer is disclosed in U.S. Patent Publication No. 2003-0025182. Also, a method of minimizing the whiskers in a Sn plating layer by forming an underlying plating is disclosed in U.S. Patent Publication No. 2002-0187364.

FIG. 1 is a schematic diagram illustrating how a whisker 130 is generated when a Sn plating layer 120 is formed on a substrate 110 formed of Cu.

Referring to FIG. 1, it is assumed that the whisker 130 is formed on the substrate 110 composed of Cu by internal stress when the Sn plating layer 120 is formed. At room temperature, the diffusion of atoms occurs through grain boundaries than the inner part of the grain. The diffusion speed of Cu atoms forming the substrate 110 is greater than the diffusion speed of Sn atoms for plating. Therefore, a copper-tin inter-metal compound $Cu_6Sn_5$ is formed at a grain boundary between the substrate 110 and the Sn plating layer since the Cu atoms preferentially diffuse to the Sn grain boundary of the plating layer. Therefore, the volume of the grain boundary expands by approximately 45%. As a result, the whisker 130 is grown by the compression stress applied to the grains.

Conventionally, to reduce the whiskers 130, the formation of a diffusion barrier layer to prevent the preferential diffusion of the Cu atoms into the grain boundary at room temperature through an annealing process, an underlying plating process, or a reflow process; the lowering of fraction of a grain boundary that provides the path of the preferential diffusion; the reduction of a diffusion capability of the grain boundary; and the reduction of the overall compression stress generated at the grain boundary between the plated layer and the substrate have been studied.

FIG. 2 is a schematic diagram illustrating how whiskers are generated when a Sn plated layer is formed on a substrate 210 formed of alloy 42 (Fe-42% Ni).

Referring to FIG. 2, when the Sn plated layer 220 is formed on the substrate 210 formed of an alloy of Fe—Ni, whiskers are generated by differences in the thermal expansion rates between the Sn plated layer 220 and the substrate 210. When a temperature cycle is applied to the Sn plated layer 220 and the substrate 210, compression stress at a high temperature is applied at a grain boundary between the Sn plated layer 220 and the substrate 210, and whiskers are grown when the temperature cycle is continually applied. Conventional methods of reducing whiskers when a Cu substrate is used are not effective since the mechanism of generating the whiskers is different from the mechanism resulting from the Cu substrate.

Also, if additional processes, such as an annealing process, an underlying plating process, or a reflow process are included to reduce the whisker, the overall process time increases and the process management is complicated, thereby increasing the manufacturing costs.

Moreover, to provide plating with a coarse grain size or aligned grains, process conditions must be strictly controlled.

Conventionally, to achieve a plating thickness of 10 micrometers, the plating must be performed for 60 seconds at 20 ampere per square deci-meter (ASD). However, in the case of a Sn pre-plated lead frame, to meet this plating condition, the overall length of the plating equipment must be great or the plating speed must be half of normal conventional plating speeds.

SUMMARY OF THE INVENTION

The present invention provides a semiconductor lead frame which can be maintained with a reduced plating time and a minimal formation of whiskers by reducing a grain size by applying a high current density using a high speed spray nozzle, a semiconductor package having the semiconductor lead frame, and a method of plating the semiconductor lead frame.

According to an aspect of the present invention, there is provided a semiconductor lead frame comprising: a substrate formed of an Fe—Ni alloy (alloy 42), and a plating layer that contains grains less than 1 micrometer in size and plated on the substrate.

The plating layer can be one of a Sn layer and/or a Sn alloy layer, and the Sn alloy layer includes at least a metal selected from the group consisting of Ag, Bi, Cu, and Zn.

According to an aspect of the present invention, there is provided a semiconductor package comprising: a semiconductor chip; a plurality of leads respectively electrically connected to terminals of the semiconductor chip; a plurality of external connection leads connected to the external terminals and connected to the leads; a molding resin that encloses the semiconductor chip, the leads, and a portion of the external connection leads; and a plating layer that contains grains less than 1 micrometer in size and plated at least on an exposed surface of the external connection leads.

The leads and the external connection leads can be formed of an Fe—Ni alloy, and the plating layer can be one of a Sn layer and/or a Sn alloy layer.

According to an aspect of the present invention, there is provided a method of plating the semiconductor lead frame comprising: preparing a substrate formed of an Fe—Ni alloy (alloy 42); and forming a Sn and/or Sn alloy plated layer having a grain size of less than 1 micrometer on an external surface of the substrate.

The Sn or Sn alloy plating can be formed using an electrical plating method in which a current density of at least 30 ASD is applied.

The plating layer can be formed by spraying a plating solution on the substrate using a high speed spraying nozzle.

According to an aspect of the present invention, there is provided a method of plating a semiconductor lead frame comprising: preparing a substrate formed of an Fe—Ni alloy (alloy 42); partially plating a Sn or Sn alloy plated layer having grains less than 1 micrometer in size on a surface of the substrate; and completing the plating by washing the substrate on which the plated layer is formed.

According to an aspect of the present invention, there is provided a method of plating a semiconductor lead frame comprising: preparing a substrate formed of an Fe—Ni alloy (alloy 42); plating a Sn striking layer on the whole surface of the substrate; partial plating a Sn or Sn alloy plated layer having grains less than 1 micrometer in size on a surface of the substrate; exfoliating the plated layer formed on a region that does not need to be plated; and completing the plating by washing the substrate on which the plated layer is formed.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings in which exemplary embodiments of the invention are shown.

Figure 1:
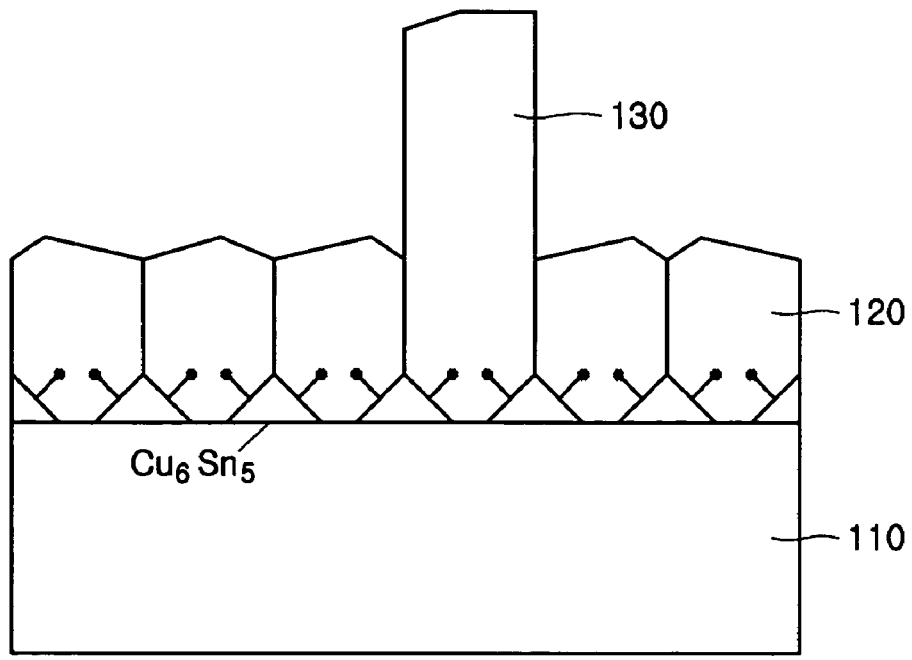
FIG. 1 is a schematic diagram illustrating how a whisker is generated when a Sn plated layer is formed on a substrate formed of Cu.
Figure 2:
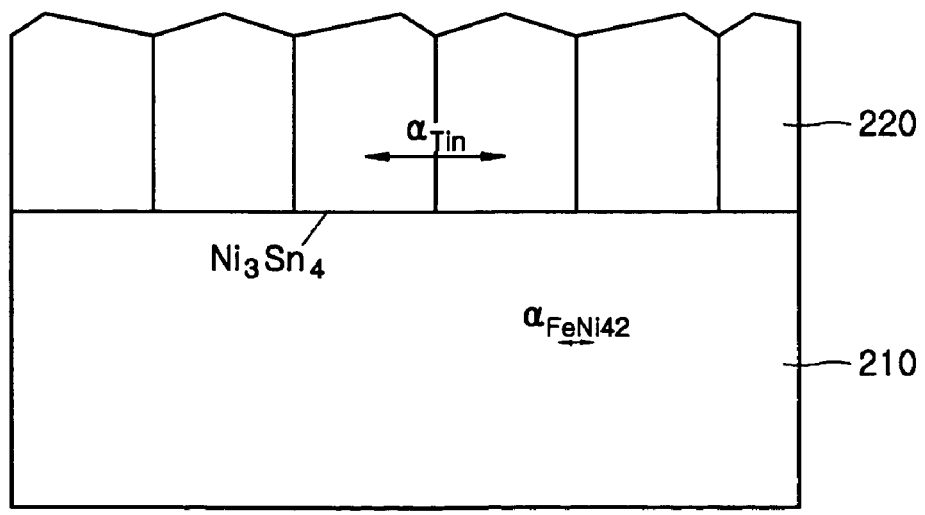
FIG. 2 is a schematic diagram illustrating how whiskers are generated when a Sn plated layer is formed on a substrate formed of alloy 42 (Fe-42% Ni)
Figure 3:
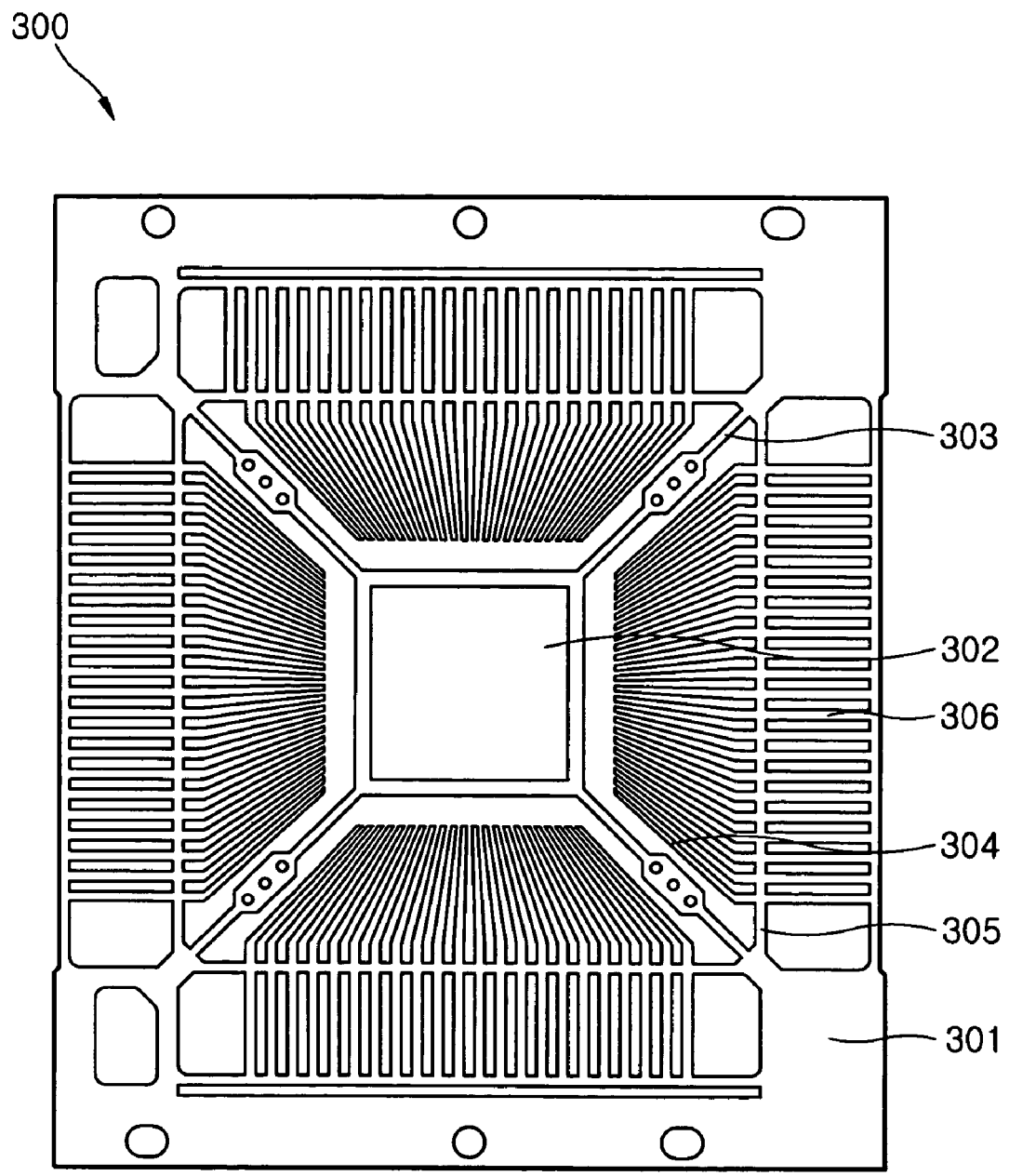
FIG. 3 is a top view of a semiconductor lead frame according to an embodiment of the present invention.

FIG. 3 is a top view of a semiconductor lead frame 300 according to an embodiment of the present invention.

Referring to FIG. 3, the semiconductor lead frame 300 comprises a die pad 302 on which a semiconductor chip is mounted. The die pad 302 is disposed at the center of a plate 301, and corners of the die pad 302 are supported by tie bars 303.

A plurality of leads 304 is disposed on edges of the die pad 302. The leads 304 are adjacently connected to a dambar 305. Wire bonding regions to be connected to terminals of a semiconductor chip to be mounted in a subsequent process are formed on edges of the leads 304. External connection leads 306 are formed on opposite sides of the dambar 305 from the leads 304 and enable the leads 304 to be connected to external terminals when the semiconductor lead frame 300 is mounted on a semiconductor package.

When the fabrication of the semiconductor package is completed, the tie bars 303 and the dambar 305 are removed.

Figure 4:
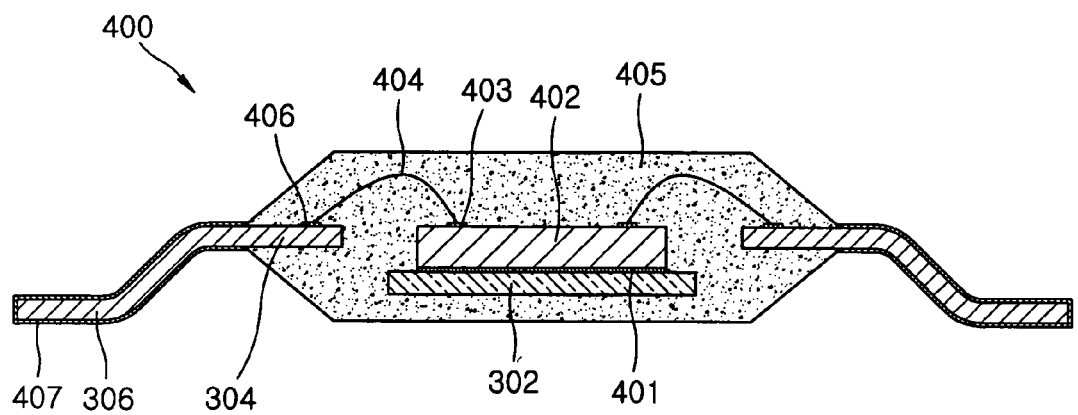
FIG. 4 is a cross-sectional view of a semiconductor package in which the semiconductor lead frame of FIG. 3 is employed.

FIG. 4 is a cross-sectional view of a semiconductor package 400 in which the semiconductor lead frame 300 of FIG. 3 is employed.

Referring to FIG. 4, a semiconductor chip 402 is attached to the die pad 302 using an adhesive member 401. The lead 304 is wire bonded to a bonding pad 403 of the semiconductor chip 402 by a wire 404. The external connection lead 306 is electrically connected to a terminal of an external circuit. The semiconductor chip 402 and the leads 304 form a semiconductor package 400 by molding using a molding resin 405.

An Ag plated layer 406 is formed on an end of the lead 304 to increase a wire bonding capability between the semiconductor chip 402 and the lead 304. Also, a Sn plated layer 407 is formed on a predetermined region of a surface of the external connection lead 306 to increase the solder wettability of the external connection lead 306 with an external substrate.

The Sn plated layer 407 can be formed of pure Sn and/or an alloy of Sn in which less than 5% of the weight of a metal such as Ag, Bi, Cu, or Zn is added.

The method of plating can be a pre-plated frame (PPF) method in which a material having high soldering wettability is pre-plated on a surface of a semiconductor lead frame before fabricating the semiconductor package. When forming a plated layer on a substrate using the PPF method, a single process is enough to form a plated layer for both wire bonding and mounting on the substrate.

A two tone pre-plated frame method which is a method of independently plating a portion corresponding to the lead 304 and a portion corresponding to the external connection lead 306 of a substrate for a lead frame using different metals. In the two tone pre-plated frame method, an Ag plated layer 406 is formed on a surface of the substrate for the lead frame and a Sn plated layer 407 is formed on a surface of the external connection lead 306. Accordingly, a semiconductor lead frame 300 (see FIG. 3) formed of an Fe—Ni alloy (alloy 42) can be used, thereby widening the range of materials that can be used.

A fabrication process of the semiconductor package 400 having the above configuration includes a semiconductor chip attaching process, a wire bonding process, and a molding process.

The semiconductor chip attaching process is a process of attaching the semiconductor chip 402 to the die pad 302 of the semiconductor lead frame 300, the wire bonding process is a process of connecting a terminal of the semiconductor chip 402 to the lead 304 of the semiconductor lead frame 300 by bonding a gold or aluminum wire, and the molding process is a process of sealing the semiconductor chip 402, the wire 404, and the lead 304 using an insulator 405 such as an EMC resin.

To improve an adhesive force of the semiconductor chip 402 and the characteristics of wire bonding of the lead 304, a plated layer 406 composed of a metal having predetermined characteristics such as Ag is formed on the die pad 302 and the lead 304.

After the molding process, a plated layer 407 formed of Sn and/or an alloy of Sn is formed on a surface of the external connection lead 306 to improve the soldering wettability of the external connection lead 306 when the external connection lead 306 exposed outside of the molding part is mounted on the substrate.

A feature of the present invention is to minimize the grain size to minimize the formation of whiskers when a substrate composed of an Fe—Ni alloy (alloy 42) is used. The Fe—Ni alloy (alloy 42) is an alloy that includes Ni 42% of the weight, Fe 58% of the weight, and minor concentration of other components.

Figure 5:
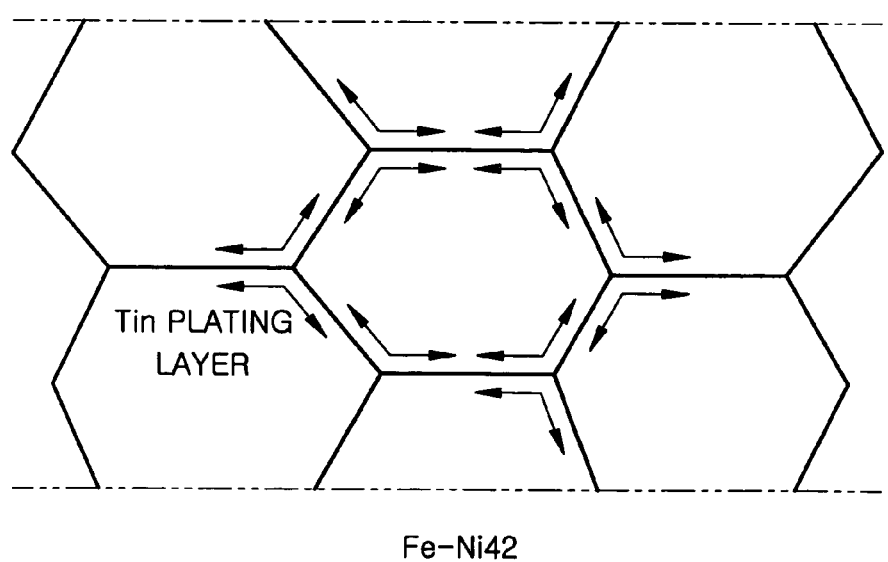
FIG. 5 is a conceptual diagram of an apparatus that can remove compression stress at a grain boundary that occurs when a Sn plated layer is formed on a substrate formed of an alloy of Fe—Ni.

FIG. 5 is a conceptual diagram of an apparatus that can remove compression stress at a grain boundary that occurs when a Sn plated layer is formed on a substrate formed of an alloy of Fe—Ni.

Referring to FIG. 5, the growth of whiskers by diffusion at room temperature does not occur since the diffusion speed of Sn into substrate composed of the Fe—Ni alloy (alloy 42) is greater than the diffusion speed of the Fe—Ni alloy (alloy 42) into the Sn plated layer 407. Therefore, the fraction of the grain boundary does not affect the growth of whiskers by diffusion at room temperature.

However, when temperature cycles are applied to the Sn plated layer 407 and the substrate formed of an Fe—Ni alloy (alloy 42), Sn has a greater tendency to expand at a high temperature since the thermal expansion coefficient of Sn is greater than that of the Fe—Ni alloy (alloy 42). Therefore, the Sn plated layer 407 experiences compression stress. Diffusion or deformation can occur at the grain boundary easier than within a grain since the structure of the grain boundary is non-uniform. Accordingly, a portion of the compression stress can be eased in the grain boundary, and the higher the fraction of the grain boundary, i.e., the smaller the size of grains, the greater this effect.

Figure 6:
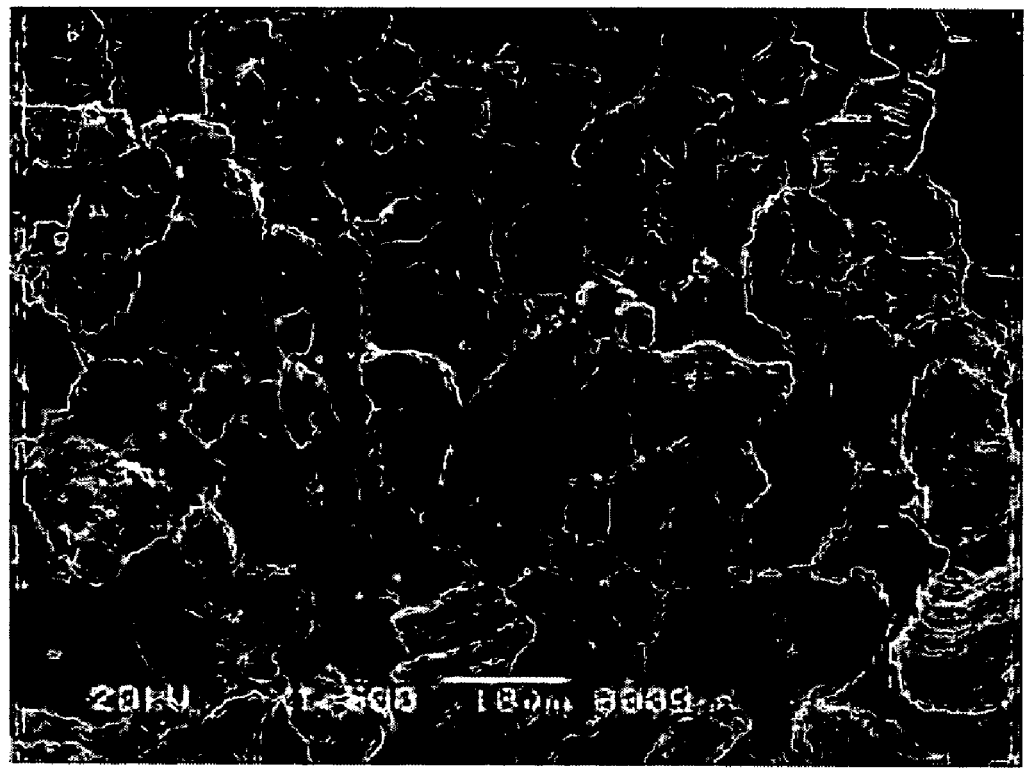
FIG. 6 is a photograph of grown whiskers of FIG. 5.

Also, referring to FIG. 6, when the temperature cycles are applied, whiskers are grown in the Sn plated layer 407 due to the compression stress caused by the thermal coefficient difference between the Sn plated layer 407 and the substrate formed of the Fe—Ni alloy (alloy 42). Simultaneously, the occurrence of breakage along the grain boundary is seen.

To continue the growth of the whiskers, tin atoms must be continuously supplied. However, as the whiskers grow, the source of tin atom is consumed due to the limitation of tin atoms in the Sn plated layer 407 and eventually the growth of the whiskers stops.

If the grain size is small, the breakage point can be increased when the breakage occurs due to temperature cycles. The increase in the breakage point denotes the limit to which the whiskers can grow when the temperature cycles are applied since paths for supplying Sn ions are disconnected at the breakage points. Consequently, the reduction in grain size can suppress the growth of the whiskers.

The conventional grain size of the Sn plated layer in the semiconductor package is 2-10 micrometers. However, according to an aspect of the present invention, the grain size of the Sn plated layer 407 can be less than 1 micrometer, thereby reducing the generation of whiskers. According to the present invention, the diameter of Sn whiskers can be controlled to approximately 1-5 micrometers in the substrate formed of the Fe—Ni alloy (alloy 42) and the maximum length of the whiskers can be controlled to less than 20 micrometers when the grain size is finely controlled.

Methods of reducing the grain size by plating include reducing the metal ion concentration, increasing the amount of additives, increasing the current density, lowering the temperature, reducing the mixing rate, and increasing the polarization.

In the present invention, the grain size is reduced by increasing the current density because, while the other methods can also reduce the grain size, the speed of plating must be reduced.

The suppression of whisker growth under temperature cycles is effective when the current density is greater than twice a conventional current density since this results in a sufficient reduction in the grain size. Furthermore, the plating time can be reduced by increasing the current density when the plating thickness is uniform, thereby improving productivity. The thickness of plating is proportional to the product of the current density by the plating time.

However, a method of increasing a critical current density is required since the Sn plated layer 407 can burn when only the current density is increased. An effective method for increasing the current density includes intensively agitating the plating solution using a high speed spray nozzle.

In this manner, a high current density can be applied since metal ions are fluently supplied to the grain boundary between the substrate formed of the Fe—Ni alloy (alloy 42) and the Sn plating solution. The Sn pre-plated lead frame uses a mask for plating a portion of the external connection lead 306, and the high speed spraying method is especially useful for applying in this structure.

The speed at which the plating solution is sprayed must be greater than 1 m/sec, and the current density must be greater than 30 ASD. As described above, less than 5% of the weight of a metal such as Ag, Bi, Cu, or Zn can be added to the Sn or Sn alloy plated layer 407 formed on the substrate formed of the Fe—Ni alloy (alloy 42).

Another method in which the grain size can be reduced is a striking plating method. That is, a semiconductor lead frame 300 is cleaned using a continuous pickling process that removes an oxide, a hydroxide, or a compound formed by corrosion from a surface of the semiconductor lead frame 300 after removing oil or impurities from the surface of the semiconductor lead frame 300.

Next, the striking partial plating is performed on the external connection lead 306 of the semiconductor lead frame 300 at 5 ASD for approximately 5 seconds. As a result, a plated layer with a thickness of approximately 0.2 micrometers is formed. At this time, the concentration of the Sn striking plating solution is approximately 20 g/L, the concentration of acid is approximately 80 ml/L, the initial concentration is approximately 40 ml/L, the concentration of an additive such as a brightener is approximately 30 ml/L, and the concentration of an additive such as an anti-oxidant is approximately 5 ml/L.

After the striking partial plating is completed, a partial plating of the Sn plated layer 407 is formed on the external connection lead 306 of the semiconductor lead frame 300. At this time, the Sn plating is performed at 50 ASD for 25 seconds, and then, a plating layer with a thickness of 10 micrometers is obtained. Also, the plating solution for forming the Sn plated layer 407 is a tin solution or a tin alloy solution in which less than 5% of the weight of Ag, Bi, Cu, or Zn is added.

In the tin plating solution, the concentration of metal ions used to form a layer when the metal ions are plated is approximately 60 ml/L, the concentration of acid that dissolves the metal ions and provides conductivity to the plating solution is approximately 60 ml/L, the concentration of an additive such as a brightener is 40 ml/L, and the concentration of an additive such as an anti-oxidant is approximately 10 ml/L.

Next, the semiconductor lead frame 300 is washed and dried after neutralization.

When the whole surface of the external connection lead 306 is striking plated to avoid the use of complex equipment, the portion of the Sn plated layer 407 plated on a surface other than the external connection lead 306 can be exfoliated using diluted nitric acid after forming a partial Sn plated layer 407 on the external connection lead 306. At this time, the process sequence is removing fat→pickling→striking plating the Sn plated layer 407 on the whole surface→Sn partial plating→exfoliation→neutralization→washing and drying.

In the present disclosure, a pre-plated lead frame method is explained. However, the external connection lead of a semiconductor package can be plated using the pre-plated lead frame method in a semiconductor packaging process to provide the external connection with fine grains to minimize the formation of whiskers.

As described above, the semiconductor lead frame according to the present invention, a semiconductor package having the semiconductor lead frame, and the method of plating the semiconductor lead frame can provide the following advantages.

First, the growth of whiskers can be suppressed by minimizing the grain size of Sn when plating Sn on a substrate formed of an Fe—Ni alloy (alloy 42).

Second, the disconnection of lead frames from external terminals and the malfunctioning of semiconductor components due to broken whisker pieces can be prevented by suppressing the growth of whiskers when forming the Sn plated layer on the substrate formed of the Fe—Ni alloy (alloy 42).

Third, the Sn plated layer on a substrate formed of an Fe—Ni alloy (alloy 42) can be formed using a high current density, which can reduce plating time, thereby improving productivity.

Fourth, the burning of the plating layer formed on the substrate formed of the Fe—Ni alloy (alloy 42) can be prevented by intensively agitating the plating solution using a high speed spray nozzle.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor lead frame comprising:
    an Fe—Ni alloy 42 substrate; and
    a first layer comprising grains less than 1 micrometer in size, wherein the first layer is plated directly onto the substrate, and a top surface of the first layer is distal to the substrate, a bottom surface of the first layer is proximate to the substrate and no second layer is disposed on the top surface of the first layer, and the first layer is a material selected from the group consisting of an Sn alloy and substantially pure Sn; and
    wherein any Sn whisker present on the first layer has a diameter within the range of approximately 1-5 micrometers and a maximum length of less than 20 micrometers.

2. The semiconductor lead frame of claim 1, wherein the first layer is the Sn alloy and the Sn alloy includes a metal selected from the group consisting of Ag, Bi, Cu, and Zn.

3. The semiconductor lead frame of claim 2, wherein the Sn alloy first layer includes less than 5% of the weight of the metal selected from the group consisting of Ag, Bi, Cu, and Zn.

4. A semiconductor package comprising:
    a semiconductor chip having a plurality of terminals;
    a plurality of leads electrically connected to terminals of the semiconductor chip;
    a plurality of external connection leads connected to external terminals and connected to the leads, wherein the leads and the external connection leads are formed of an Fe—Ni alloy;
    a molding resin that encloses the semiconductor chip, the leads, and a portion of the external connection leads; and
    a first plating layer that contains grains less than 1 micrometer in size and is plated directly on at least an exposed surface of the external connection leads, and a top surface of the first plating layer is distal to the external connection leads, a bottom surface of the first plating layer is proximate to the external connection leads and no second layer is disposed on the top surface of the first plating layer, and the first plating layer is a material selected from the group consisting of an Sn alloy and substantially pure Sn; and
    wherein any Sn whisker present on the first plating layer has a diameter within the range of approximately 1-5 micrometers and a maximum length of less than 20 micrometers.

5. The semiconductor package of claim 4, wherein the Fe—Ni alloy comprises Fe—Ni alloy 42.

6. The semiconductor package of claim 4, wherein the first plating layer is the Sn alloy and the Sn alloy includes at least a metal selected from the group consisting of Ag, Bi, Cu, and Zn.

7. The semiconductor package of claim 6, wherein the Sn alloy first plating layer includes less than 5% of the weight of a metal selected from the group consisting of Ag, Bi, Cu, and Zn.

8. The semiconductor package of claim 4, further comprising an Ag plated layer formed on an external surface of the leads.

9. A method of plating a semiconductor lead frame comprising:
    preparing a substrate formed of an Fe—Ni alloy (alloy 42); and
    forming a Sn plated layer or a Sn alloy plated layer having grains less than 1 micrometer in size on an external surface of the substrate; and
    wherein any Sn whisker present on the Sn plated layer has a diameter within the range of approximately 1-5 micrometers and a maximum length of less than 20 micrometers.

10. The method of claim 9, wherein the Sn or Sn alloy plating is formed using an electrical plating method in which a current density of at least 30 ampere per square deci-meter (ASD) is applied.

11. The method of claim 10, wherein the plating layer is formed by spraying a plating solution on the substrate using a spray nozzle.

12. The method of claim 11, wherein the speed of spraying the plating solution is greater than 1 m/sec.

13. A method of plating a semiconductor lead frame comprising:
preparing a substrate formed of an Fe—Ni alloy (alloy 42);
partially plating a Sn or Sn alloy plated layer having grains less than 1 micrometer in size on a surface of the substrate; and
completing the plating by washing the substrate on which the plated layer is formed; and
wherein any Sn whisker present on the plated layer has a diameter within the range of approximately 1-5 micrometers and a maximum length of less than 20 micrometers.

14. The method of claim 13, further comprising:
plating a Sn striking layer on a surface of the substrate; and
exfoliating a portion of the plated layer formed on a region that does not need to be plated.

15. The method of claim 14, wherein the plated Sn striking layer is approximately 0.2 micrometers thick and is plated on an external connection lead of the semiconductor lead frame.

16. The method of claim 14, wherein:
the Sn striking layer plating step uses an Sn striking plating solution having a concentration of approximately 20 g/L.

\* \* \* \* \*